(12) United States Patent
Stolt et al.

(10) Patent No.: US 12,047,018 B2
(45) Date of Patent: Jul. 23, 2024

(54) APPARATUS AND METHODS INVOLVING CONTROL OF PIEZOELECTRIC RESONANCE CIRCUITS

(71) Applicant: The Board of Trustees of the Leland Stanford Junior University, Stanford, CA (US)

(72) Inventors: Eric Stolt, Stanford, CA (US); Juan M. Rivas-Davila, Palo Alto, CA (US); Weston D. Braun, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 17/961,064

(22) Filed: Oct. 6, 2022

(65) Prior Publication Data
US 2023/0130908 A1 Apr. 27, 2023

Related U.S. Application Data

(60) Provisional application No. 63/253,418, filed on Oct. 7, 2021.

(51) Int. Cl.
*H02N 2/06* (2006.01)
*H02N 2/18* (2006.01)

(52) U.S. Cl.
CPC ............. *H02N 2/067* (2013.01); *H02N 2/181* (2013.01)

(58) Field of Classification Search
CPC .... H03H 9/1035; H03H 9/02031; H03H 9/13; H03H 9/173; H03H 9/176; H03H 9/02118; H03H 9/105; H03H 9/132; H03H 9/171; H03H 3/02; H03H 2003/021; H03H 2003/023
See application file for complete search history.

(56) References Cited

U.S. PATENT DOCUMENTS

| | | | |
|---|---|---|---|
| 6,016,052 A * | 1/2000 | Vaughn | H05B 41/2822 310/318 |
| 11,101,792 B2 | 8/2021 | Rivas-Davila et al. | |
| 11,228,252 B2 | 1/2022 | Rivas-Davila et al. | |
| 11,381,230 B2 * | 7/2022 | Yu | H03H 9/423 |

(Continued)

OTHER PUBLICATIONS

E. A. Stolt, W. D. Braun and J. M. Rivas-Davila, "Forward-Zero Cycle Closed-Loop Control of Piezoelectric Resonator DC-DC Converters," 2022 IEEE 23rd Workshop on Control and Modeling for Power Electronics (COMPEL), Tel Aviv, Israel, 2022, pp. 1-6.

(Continued)

*Primary Examiner* — Emily P Pham
(74) *Attorney, Agent, or Firm* — Crawford Maunu PLLC

(57) ABSTRACT

In certain examples, methods and semiconductor structures are directed to operation of a piezoelectric-based device (e.g., a DC-DC converter) and such operation may involve selectively switching inputs of the piezoelectric-based device at a modulation frequency and, in response, decoupling of the modulation frequency from output power delivered by the piezoelectric-based device. In some examples, the inputs of the piezoelectric-based device are selectively switched to cause decoupling the modulation frequency from output power delivered by the piezoelectric-based device and/or cause operation of the piezoelectric-based device without spurious mode operation.

21 Claims, 11 Drawing Sheets

(56) References Cited

U.S. PATENT DOCUMENTS

| | | |
|---|---|---|
| 11,411,536 B2 | 8/2022 | Surakitbovorn et al. |
| 2016/0101618 A1* | 4/2016 | Kashimura .............. B41J 2/155 |
| | | 327/111 |
| 2022/0103141 A1 | 3/2022 | Tong et al. |
| 2022/0200449 A1 | 6/2022 | Perreault et al. |
| 2023/0122538 A1 | 4/2023 | Rivas-Davila et al. |

OTHER PUBLICATIONS

E. Stolt et al., "Fixed-Frequency Control of Piezoelectric Resonator DC-DC Converters for Spurious Mode Avoidance," in IEEE Open Journal of Power Electronics, vol. 2, pp. 582-590, Nov. 2021. Content filed as Appendix in priority U.S. Appl. No. 63/253,418.
Braun, Weston D., et al. "Optimized resonators for piezoelectric power conversion." IEEE Open Journal of Power Electronics 2 (2021): 212-224.
W. D. Braun, Z. Tong and J. Rivas-Davila, "Inductorless Soft Switching DC-DC Converter with an Optimized Piezoelectric Resonator," 2020 IEEE Applied Power Electronics Conference and Exposition (APEC), New Orleans, LA, USA, 2020, pp. 2272-2278.

* cited by examiner

APPARATUS AND METHODS INVOLVING CONTROL OF PIEZOELECTRIC RESONANCE CIRCUITS

BACKGROUND

Aspects of the present disclosure are related generally to the field of amplifier circuits, and more particularly to increase power density in amplifier circuits such as DC-DC converters.

Using DC-DC converters as one type of amplifier technology for ease of discussion, it has been appreciated that a drive to increase DC-DC converter power density has led switch-mode converters to higher operating frequencies where the volume of energy storage elements can decrease. Yet, many converter topologies require inductors as energy storage elements, and inductors experience shortcomings at both high frequencies and small volumes. These deficiencies of inductors have prompted the exploration of power converters with different energy storage elements. Through efficient coupling of mechanical vibrations to resonant voltages and currents, piezoelectric resonators offer theoretically higher power density and quality factor than inductors, suggesting a promising alternative energy storage element.

In connection with one effort involving DC-DC converter topologies with a piezoelectric resonator, topologies of this type with a piezoelectric resonator have been considered as a most viable energy storage element. Oftentimes, a certain type of these topologies which is sometimes referred to as a stacked topology (e.g., as may be referenced throughout the present disclosure for convenience in terms of facilitating an understanding of the present disclosure), but there are a wide variety of relevant topology types. Using the stacked converter topology as an example, a piezoelectric resonator is connected between two of its switching nodes, and for understanding the operation of the piezoelectric resonator, the Butterworth Van-Dyke (BVD) equivalent circuit model may be used. This circuit model translates the piezoelectric resonator's electrical response near its mechanical resonance into a simple circuit consisting of a series RLC motional branch in parallel with an input capacitance formed by the electrodes.

The series and parallel resonant frequencies of the BVD circuit define the inductive region of the resonator's impedance and bound a converter's ideal operating frequency range. Maximum-efficiency control of ideal piezoelectric resonator DC-DC converters, referred to here as standard control, involves unidirectional power flow each resonant cycle and soft charging of the resonator's parallel input capacitance. These aspects or requirements of standard control create a fully constrained system where a converter's switching frequency determines the output power for a given conversion ratio. Maximum power occurs at the series resonant frequency; as frequency increases from the series resonance, output power decreases and converter efficiency increases until the maximum efficiency point is reached. However, standard control assumes the converter has a single mode resonator, and single mode resonators are hard to achieve. If additional minor resonances exist in-band, the performance near these modes are less inductive, lowering the equivalent inductor quality factor. Such secondary resonances, with detrimental effects to the device performance, are called spurious modes. They originate from resonator geometry, electrode patterning, and mounting, and tend to plague the high coupling and low loss operating region.

Various efforts have been made to limit these detrimental effects, and some of these efforts have proven to be fruitful, but oftentimes these efforts result in disadvantageous operation such as a limited range of the power which might otherwise be delivered by the piezoelectric-based devices. For instance, current methods for controlling piezoelectric based DC-DC converters may cause output power to depend on the switching frequency used to drive such a DC-DC converter but a commercially-practical piezoelectric based DC-DC converter should be able to operate over a full output power range (e.g., in contrast to the dependence of output power on frequency which causes spurious modes to fragment current in the converter's output power range.

Further, in some instances such efforts have involved burdensome circuity such as may be needed for controlling input signals to the piezoelectric-based devices.

SUMMARY OF VARIOUS ASPECTS AND EXAMPLES

Various examples/embodiments presented by the present disclosure are directed to addressing and/or overcoming issues such as those mentioned above and/or others which may become apparent from the following disclosure. Some of these disclosed aspects are directed to methods and devices that use or leverage from unexpected recognition of the relationship between attributes of a piezoelectric resonance device in connection with operation of certain types of circuits such as amplifiers and DC-DC converters. Other aspects are directed to overcoming disadvantages of certain previously-used techniques, such as discussed above, by causing such a device to avoid operation in a spurious mode and/or decouple the modulation frequency from the output power to be delivered by the device.

In certain more-specific examples, aspects of the present disclosure are directed to methods and apparatuses involving use, operation and/or design of a piezoelectric-based resonance device (e.g., a DC-DC converter), wherein the device is operated by way of selectively switching inputs of the piezoelectric-based device at a modulation frequency and, in response, causing a decoupling of the modulation frequency from output power delivered by the piezoelectric-based device. In some examples, by selectively switching the inputs, the operation of the piezoelectric-based device is controlled without spurious mode operation.

In certain other more-specific examples which may build on the above aspects, a method and/or a semiconductor device includes such piezoelectric-based device and the piezoelectric-based device is controlled so that current circulates in the piezoelectric-based device as a result of selectively switching the inputs. Further, the inputs may be switched at a modulation frequency which is fixed (e.g., without relying on acoustic optimization).

In certain other examples which may also build on the above-discussed aspects, methods and semiconductor structures are directed to operating the piezoelectric-based device without detrimentally effecting operation efficiency over a maximum load range specified for the piezoelectric-based device while the modulation frequency overlaps with one or more spurious mode frequency regions.

In more specific examples related to the above methodology and/or devices, switching inputs of the piezoelectric-based device selectively is done to provide closed-loop, hysteretic control over the operation of the piezoelectric-based device.

In yet other examples, embodiments concern a fixed-frequency modulation control for avoiding spurious modes in operation of the piezoelectric-based device, and this enables the realization of piezoelectric resonator DC-DC converters that can operate across a full load range. In a related more-specific example, an experimental example embodiment employs fixed-frequency control mode for decoupling power and frequency in piezoelectric resonator DC-DC converters. The fixed-frequency control enables the converters to operate efficiently across a full load range while avoiding spurious modes. Further, models for power, efficiency, and ripple scaling of a mixed sequence for the inputs are implemented along with a simplified method for calculating mixed sequence switch timings. These experimental examples verify that fixed-frequency control can avoid spurious modes and extend operating range with a prototype piezoelectric resonator DC-DC converter and lithium niobate resonator. For example, at a conversion ratio of 60V to 30 V, fixed-frequency control extends the prototype's output power range by a factor of 2.7, and correspondingly such development of fixed-frequency control represents high quality factor piezoelectric resonators that can be used for improving control of converters and their performance.

In yet further specific example embodiments and/or applications, converters and/or other circuits according to the present disclosure are directed to applications and environments that prohibit magnetic material (e.g., such as in magnetic-resonant imaging (MRI) machines.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description in connection with the accompanying drawings, each in accordance with the present disclosure, in which.

Figure 1A:
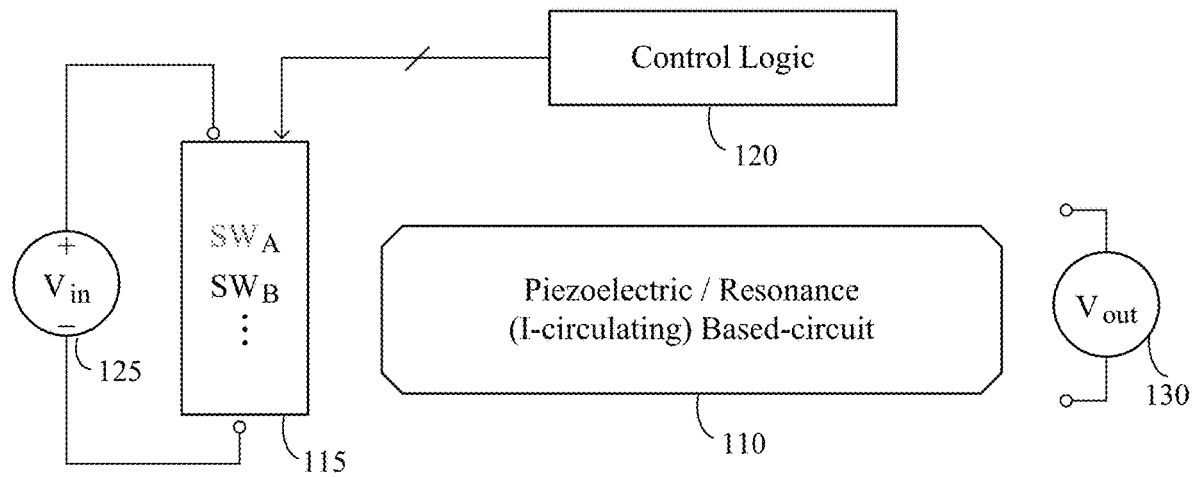
FIG. 1A is a block diagram of a piezoelectric-resonance-based (PR-based) circuit, according to certain exemplary aspects of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods including but not necessarily limited to devices characterized at least in part by controlling a piezoelectric-based resonance device (e.g., a piezoelectric resonator and/or a piezoelectric transformer) as may be used as part of a DC-DC converter, with a frequency-applied control at the inputs for avoiding spurious modes in operation of the device. While the present disclosure is not necessarily limited to such aspects, an understanding of specific examples in the following description may be understood from discussion in such specific contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Exemplary aspects of the present disclosure are related to directed to methods and apparatuses involving use, operation and/or design of a piezoelectric-based resonance device (e.g., a DC-DC converter), wherein the device is operated by way of selectively switching inputs of the piezoelectric-based device to cause a decoupling of the modulation frequency from output power delivered by the piezoelectric-based device and/or to control the device to cause the device to avoid operating in the regions corresponding to spurious mode operation. In some examples, the switching inputs are selectively switched to realize this decoupling and such avoidance of the device operating in a spurious mode region.

Consistent with the above aspects, such a manufactured device or method of such manufacture may involve aspects presented and claimed in U.S. Provisional Application Ser. No. 63/253,418 filed on Oct. 7, 2021 (STFD.435P1 S21-346) with an Appendix, to which priority is claimed. Such subject matter is incorporated by reference in its entirety generally and to the extent that further aspects and examples (such as experimental and/or more-detailed embodiments) may be useful to supplement and/or clarify.

According to certain more specific examples, the present disclosure is directed to a circuit-based apparatus (e.g., system, arrangement of components and/or device including circuitry) and alternatively, a method of using such an apparatus including a piezoelectric-based resonance device by selectively switching inputs of the piezoelectric-based device to cause a decoupling of the modulation frequency from output power delivered by the piezoelectric-based device and/or to control the device so as to cause the device to avoid operating in the regions corresponding to spurious mode operation. The switching inputs may be selectively switched at a modulation frequency (e.g., a fixed modulation frequency) to realize circulation of current within the device and to bring about this decoupling and/or avoidance of the device operating in a spurious mode region.

While certain previous DC-DC conversion applications employing piezoelectric resonators or piezoelectric transformers have used closed-loop regulation with frequency-modulation for voltage regulation, they rely on sensing multiple voltages throughout a resonant period and they use variable frequency-modulation control that results in spurious resonances, which can lower efficiency and restrict operation to narrow load ranges. Spurious resonant modes are secondary resonances in a piezoelectric resonator that disturb the ideal inductive operating region with pockets of high resistance, lower than 90° phase, and non-uniform impedance. These disruptive resonances are difficult to predict with a zero cycle, which is a cycle that shorts the resonator (across terminals of the resonator such as by turning on switches $S_2$ and $S_3$ in the stacked topology of FIG. 1C) for an entire resonant period and does not send any power to the load. In contrast to a zero cycle, a forward cycle may be considered as a cycle which switches the resonator between multiple open and connected states to transfer power between the input and the output.

According to certain specific example embodiments, the present disclosure is directed to a circuit-based apparatus and/or a method of using such an apparatus including a piezoelectric-based (resonance) device by selectively switching inputs of the piezoelectric-based device, via a mixed sequence (or combination) of forward and zero cycles, to cause a decoupling of the modulation frequency from output power delivered by the piezoelectric-based device and/or to control the device so as to cause the device to avoid operating in the regions corresponding to spurious mode operation. The mixed sequence of switching inputs realize circulation of current within the device and to bring about this decoupling and/or avoidance of the device operating in a spurious mode region. By using a combination of forward and zero cycles results in a mixed switching sequence, the switching sequence is controlled to provide sufficient freedom to allows modulation of output power at a fixed switching frequency (e.g., as may be used in more-specific example embodiments) and conversion ratio.

Before turning to the drawing to be discussed in detail below, it is noted that certain of the example embodiments presented herein involve prototype piezoelectric-based (resonance) devices in the form of DC-DC converters to illustrate exemplary aspects and certain example embodiments of the present disclosure, wherein piezoelectric-based (resonance) devices refer to or include devices that use a piezoelectric device in a circuit that is to resonate. However, as is apparent to the skilled artisan, such example embodiments, aspects, and applications of the present disclosure are not so limited. In this context, in addition to or instead of DC-DC converters, further specific examples of the present disclosure may be directed to embodiments, aspects, and applications involving other circuits (e.g., amplifiers, regulators, buffers, etc.) which may use one or more piezoelectric-based devices with switchable inputs which can be controlled so that the one or more piezoelectric-based devices may resonate according to one or more aspects consistent with the claimed invention.

Figure 1B:
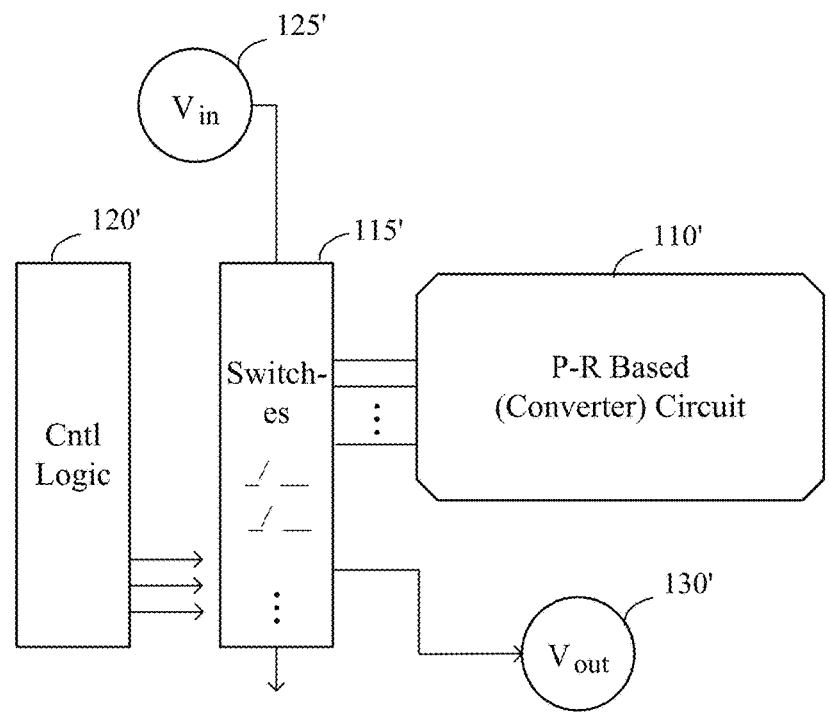
FIG. 1B is another block diagram of a PR-based circuit, according to certain exemplary aspects of the present disclosure.
Figure 1C:
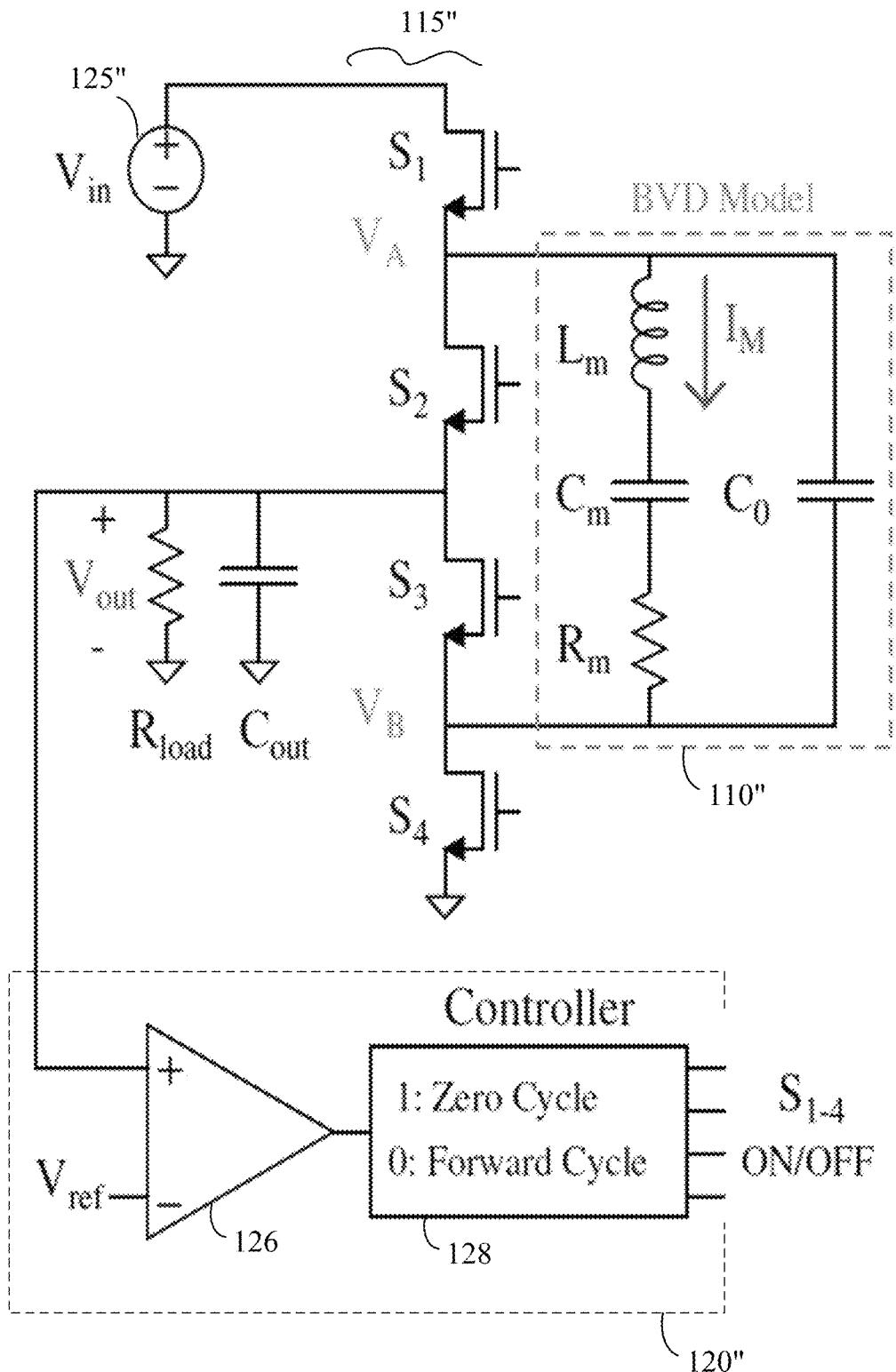
FIG. 1C is yet another block diagram of a PR-based circuit, according to certain exemplary aspects of the present disclosure.

FIGS. 1A and 1B illustrate examples of alternative DC-DC converter circuits having a piezoelectric-based device for the purposes of discussion, to exemplify certain aspects of the present disclosure (e.g., with apostrophes appended to reference numerals so show related types of circuits such as 110 and 110' respectively of FIGS. 1A and 1B, and similarly 110" of FIG. 1C). Each of FIGS. 1A and 1B shows a DC-DC converter which includes a piezoelectric-based device 110, 110', switching circuitry 115, 115', and control logic 120, 120'. The control logic which is used to provide input signals for driving input ports of the switching circuitry, may take any of a variety forms including as examples, a microcomputer, discrete logic circuitry, and/or a field-programmable logic array (FPLA). Each of these DC-DC converter circuits is operated by selectively switching inputs of the piezoelectric-based device to cause a decoupling of the modulation frequency from output power delivered by the piezoelectric-based device and/or to control the device to cause the device to avoid operating in the regions corresponding to spurious mode operation. In some examples, the switching inputs are selectively switched to realize this decoupling and such avoidance of the device operating in a spurious mode region.

While each of FIG. 1A and FIG. 1B shows direct current (DC) based voltage input sources 125, 125' and voltage output 130, 130' (e.g., terminals where a DC-based voltage is to be provided for connecting to a load), the DC-DC converter circuits may be configured differently in multiple regards. As examples, the numbers and types of transistors used to implement the respective blocks representing the switching circuitry 115 and 115', and the number of inputs to control the transistors, may be different, as well as the types of circuits. And arrangement and connectivity of circuits used in each of switching circuitry 115, 115' may differ. Further, the manners in which the voltage input sources 125, 125' and voltage output 130, 130' may differ including, for example, with the voltage output 130, 130' being provided independent of the switching circuitry 115 (FIG. 1A) or through the switching circuitry 115' (FIG. 1B).

Also, as shown by "(I-circulating)" in FIG. 1A, in certain (e.g., selective) operational modes, the piezoelectric-based device 110 may be controlled such that current is circulated within the piezoelectric-based device 110. In this manner, such a piezoelectric-based device 110, 110' may be controlled so that current ("I") circulates in the piezoelectric-based device as a result of selectively switching the inputs.

As yet a further possible variation also according to an example aspect of the present disclosure, but not shown in either of FIGS. 1A and 1B, such a DC-DC converter may be implemented to selectively provide the switching inputs in a closed-loop, hysteretic-control configuration for the operation of the piezoelectric-based device. By such control, more refined voltage regulation is provided by the converter and this control approach may more-readily scale to higher frequency and improve transient response to load variations.

Consistent with this closed-loop hysteretic control aspect according to the present disclosure, FIG. 1C shows a more specific example of a DC-DC converter 110" and with switching circuitry 115" including transistors (e.g., field-effect type) in a "stacked" topology with input voltage $V_A(t)$ controlled between transistors S1 and S2 and input voltage $V_B(t)$ controlled between transistors S3 and S4. The piezoelectric-based device 110" is shown in dashed lines via a Butterworth Van-Dyke (BVD) equivalent circuit model which as noted above translates the piezoelectric resonator's electrical response near its mechanical resonance into a simple circuit consisting of a series RLC motional branch in parallel with an input capacitance $C_o$, formed by the electrodes. This type of BVD model may be useful in characterizing many piezoelectric devices including those shown in FIGS. 1A and 1B. FIG. 1C also shows a logic circuit 120" including an amplifier 126 and a controller 128, with the amplifier 126 driving the controller 128. In this manner, the controller 128 may be operated to selectively provide the switching inputs of the piezoelectric-based device for closed-loop (via feedback from Vout to the amplifier 126), hysteretic control over the operation of the piezoelectric-based device. The amplifier 126, configured as a comparator, is shown with its negative input terminal being driven by a voltage reference (Vref) for setting the degree of hysteresis, and with its positive input terminal being driven by Vout from an output of the piezoelectric-based device 110" as feedback for the closed loop.

Figure 2:
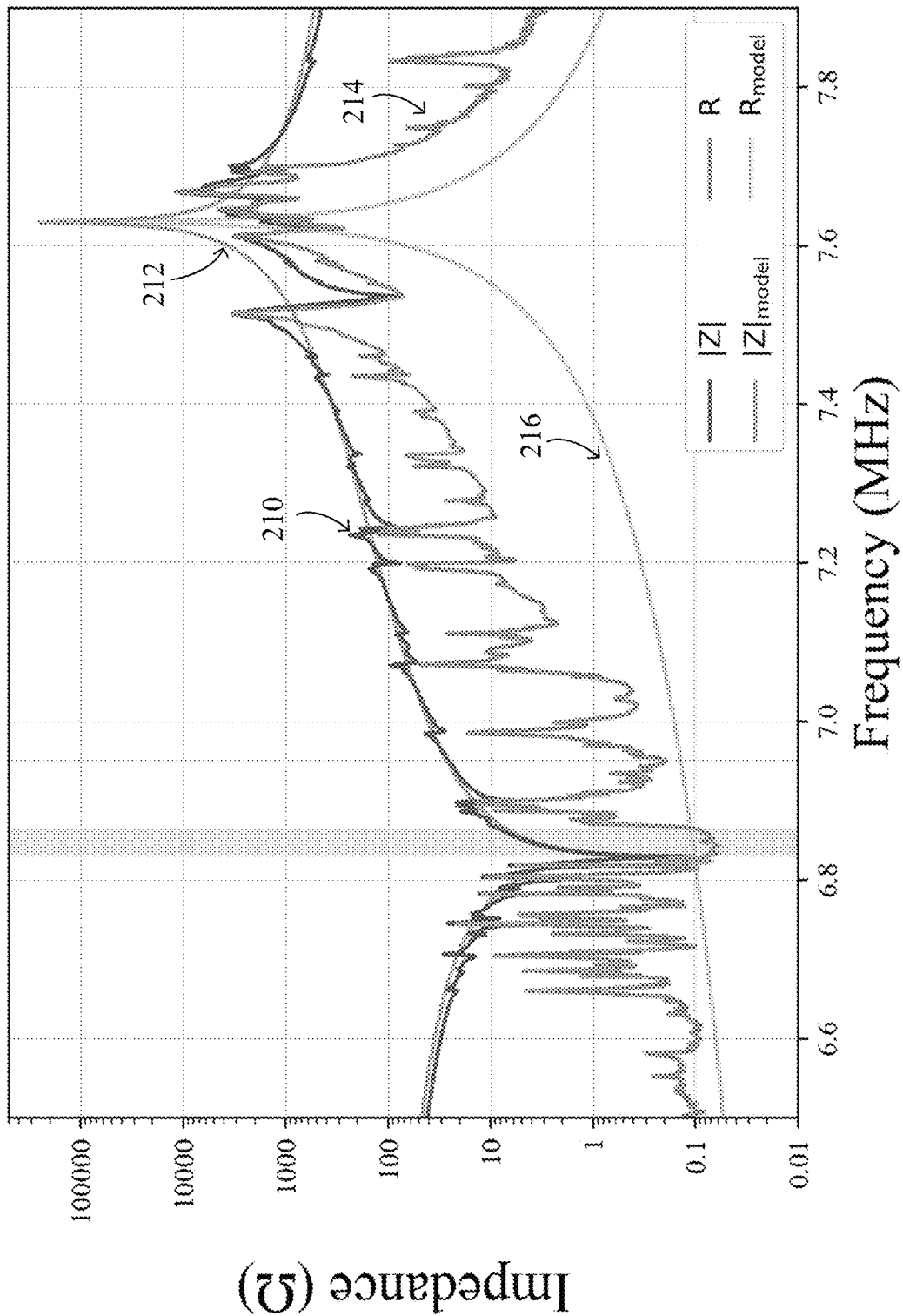
FIG. 2 is a graph showing plots of modeled resonator impedance and resistance (Y axis) versus frequency (X axis) of a Butterworth Van-Dyke (BVD) equivalent circuit.

FIG. 2 is a graph showing plots of modeled resonator impedance and resistance (Y axis) versus frequency (X axis) of a Butterworth Van-Dyke (BVD) equivalent circuit in connection with a lithium niobate resonator as used in certain experimental embodiments, and with results and the like according to the present disclosure, with the modeled impedance of a BVD equivalent circuit fit to the resonator's main resonant mode (for fabrication details of this type of resonator, reference may be made to the above-referenced US Provisional Application). In FIG. 2, the plot lines 210, 212 respectively show actual and modeled impedance ("Z", showing similar plots), whereas the plot lines 214, 216 respectively show actual and modeled resistance ("R") as being quite distinct from one another.

Lithium niobate is a beneficial piezoelectric material due to its high-coupling coefficient and lower loss than in PZT. The resonator's thickness extensional mode achieves higher power density and lower impedance than other resonant modes, such as radial and lateral, but at the cost of more spurious modes. The ideal operating range of this type of resonator is bounded by the series resonant frequency at 6.83 MHz and the parallel resonant frequency at 7.64 MHz. The first spurious mode appears at 6.87 MHz where the impedance is disturbed and the resistance rises far above the modeled resistance. Beyond 6.87 MHz, more spurious modes cause the resonator's resistance to continue diverging from the single motional branch model. These spurious modes are often difficult to predict and control when designing a resonator because they require a full 3-D resonator model and are sensitive to fabrication variations. Even though spurious modes are difficult to predict, batch fabrication of resonators from lithium niobate wafers yielded resonators with identical spurious modes. Thus, any implementation at scale could reliably pre-program the spurious mode locations without having to measure every resonator. Although techniques exist for reducing spurious modes, these techniques often reduce device performance such as the resonator's coupling coefficient, quality factor, and capacitance density. Moreover, most techniques for eliminating spurious modes in certain types of resonators (e.g., MEMs) do not translate to resonators for power conversion due to different design goals and orders of magnitude difference in size.

When a converter's switching frequency intersects with a spurious mode, losses often become too high to operate due to high resistance and a less inductive phase causing the loss of zero-voltage switching (ZVS). While standard control maximizes efficiency, the dependence of output power on frequency limits converters to only the load conditions corresponding to spurious-free frequency regions. For example, spurious modes restrict the type of prototype resonator used in experiments in the present disclosure to only operate between 6.835 MHz and 6.861 MHz despite a design aimed at maximizing the spurious-free frequency region.

In certain specific example embodiments, the present disclosure is directed to aspects concerning use of a fixed-frequency modulation control for avoiding spurious modes in operation of the piezoelectric-based device. This type of control may be used to enable the realization of piezoelectric resonator DC-DC converters, via relatively simple front-end modulation circuitry, that can operate across a full load range (e.g., as a significant improvement over the load range delivered by certain previously-known devices). In a related and more-specific example according to the present disclosure, an experimental example embodiment employs fixed-frequency control mode for decoupling power and frequency in piezoelectric resonator DC-DC converters. The fixed-frequency control enables the converters to operate efficiently across a full load range while avoiding spurious modes. Further, models for power, efficiency, and ripple scaling of a mixed sequence for the inputs are implemented along with a simplified method for calculating mixed sequence switch timings. These experimental examples verify that fixed-frequency control can avoid spurious modes and extend operating range with a prototype piezoelectric resonator DC-DC converter and lithium niobate resonator. For example, at a conversion ratio of 60 V to 30 V, fixed-frequency control extends the prototype's output power range by a factor of 2.7. The development of fixed-frequency control represents how using certain energy storage elements such as high quality factor piezoelectric resonators can enable improved ways of controlling converters and while yielding better performance.

In connection with an experimental test as background leading up to discoveries in connection with the present disclosure, the measured impedance of a lithium niobate resonator and the modeled impedance of a BVD equivalent circuit were plotted to fit to the resonator's main resonant mode. Lithium niobate is chosen as the piezoelectric material for its known high coupling coefficient and lower loss than PZT. The resonator's thickness extensional mode achieves higher power density and lower impedance than other resonant modes, such as radial and lateral, but at the cost of more spurious modes. An ideal operating range of this particular resonator (as used in such exemplary experimental implementation) is bounded by the series resonant frequency at 6.83 MegaHertz ("MHz") and the parallel resonant frequency at 7.64 MHz. The first spurious mode appears at 6.87 MHz where the impedance is disturbed and the resistance rises far above the modeled resistance. Beyond 6.87 MHz, more spurious modes cause the resonator's resistance to continue diverging from the single motional branch model. These spurious modes are often difficult to predict and control when designing a resonator because they involve a full 3-D resonator model and are sensitive to fabrication variations. Even though spurious modes are difficult to predict, batch fabrication of exemplary resonators from lithium niobate wafers yielded resonators with identical spurious modes. Thus, any implementation at scale could reliably pre-program the spurious mode locations without having to measure every resonator. Although techniques exist for reducing spurious modes, these techniques often reduce device performance such as the resonator's coupling coefficient, quality factor, and capacitance density. Moreover, most techniques for eliminating spurious modes in MEMS resonators do not translate to resonators for power conversion due different design goals and orders of magnitude difference in size.

When a converter's switching frequency intersects with a spurious mode, losses often become too high to operate due to high resistance and a less inductive phase causing the loss of ZVS. While standard control maximizes efficiency, the dependence of output power on frequency limits converters to only the load conditions corresponding to spurious-free frequency regions. For example, spurious modes restrict certain experimental prototype resonators including resonators used in certain experimental efforts disclosed herein, to only operate between 6.835 MHz and 6.861 MHz despite a design aimed at maximizing the spurious-free frequency region. Other research into piezoelectric resonator DC-DC converters also reports spurious modes reducing efficiency and operating range.

Control of piezoelectric resonator DC-DC converters can be analyzed as a pattern of switching states, called a switching sequence, over one or more resonant cycles to establish a periodic steady state operating point. Maximum efficiency switching sequences constraints for unidirectional power flow each resonant cycle have been studied and reported. To achieve high-efficiency, soft-switching operation, the resonator is switched between alternating open and connected states. Connected states involve one switch of each switching node to conduct, which transfers power between the resonator, the input, and the output. Open states commutate switching modes for soft switching by turning off both switches connected to the commutating node and turning on one switch at the opposing node. The composition of alternating connected and open states throughout one resonant period constitutes a switching cycle. A switching cycle with unidirectional power flow from the input to the output is referred to here as a forward cycle, and standard control employs operation with continuously repeated forward cycles. Piezoelectric resonator DC-DC converters have largely, if not exclusively, been demonstrated using standard control because this maximizes efficiency and minimizes circulating current.

Figure 3:
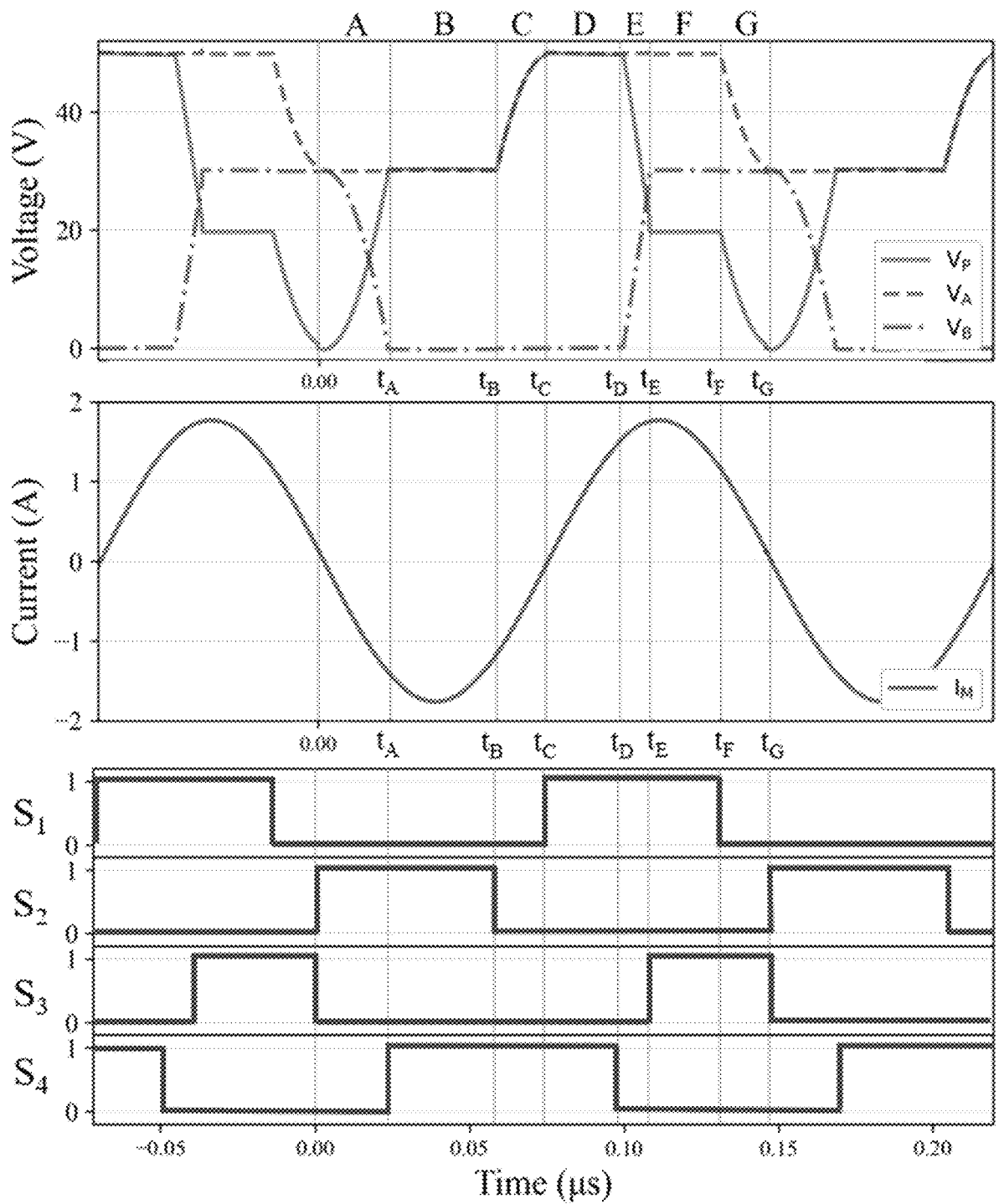
FIG. 3 is a graph showing forward cycle switching waveforms, according to certain exemplary aspects of the present disclosure.

FIG. 3 shows an example of steady-state switching node voltage and motional current waveforms for two forward cycles of a standard switching sequence with connected states ordered [$V_{out}$, $V_{in}$, $V_{in}-V_{out}$]. The switching node voltages, voltage across the resonator $V_p$, and switch signals for each state are listed in Table 1 which follows.

Producing exact expressions for a switching sequence's periodic steady state behavior involves solving and concatenating multiple equations for each switching state. This yields complex, non-intuitive results; however, making a few approximations can accurately model the system with tangible equations. Due to the high quality factor of piezoelectric resonators (as may be characterized by an ability to oscillate for many cycles (e.g., more than several)), the motional current can be approximated as sinusoidal with:

$$I_m(t)=I_{m0}\sin(wt) \quad (1)$$

The amplitude of the motional current for a standard sequence, $I_{m_0}$, is given by:

$$I_{m0}=V_{m0}/Z_m \quad (2)$$

$V_{m0}$ is the fundamental component of the voltage across the resonator, and $Z_m$ is the series impedance of $R_m$, $L_m$, and $C_m$ at the switching frequency. The "naught" subscript denotes the standard switching sequence throughout the present disclosure. At different switching frequencies, variations in switch timings and open state durations will change $V_{m0}$, yet $Z_m$ changes more significantly than $V_{m0}$ with frequency, allowing for the approximation that $V_{m0}$ is constant. The output power for each forward cycle and the standard sequence overall is:

$$P_{out_0}=I_{out_0}V_{out} \quad (3)$$

Neglecting switch parasitics, the output DC current relates to the amplitude of the AC motional current through:

$$I_{out_0} = \frac{A}{\pi}I_{m_0} - Af_{sw_0}C_oV_{in} \quad (4)$$

Variable A depends on conversion ratio and topology, and A=1 for the stacked topology with a 2:1 conversion ratio tested in Section V. At larger values of $I_m$, the constant term in (4) can be approximated as negligible producing the relationship:

$$I_{out_0} \propto I_{m_0} \quad (5)$$

For standard sequence control, equations (2-5) show how changing the switching frequency changes $Z_m$, which in turn sets $I_{m_0}$, $I_{out_0}$, and $P_{out_0}$. Thus, standard sequence control causes the output power to depend directly on switching frequency.

In connection with certain exemplary embodiments according to the present disclosure, the piezoelectric-based devices are controlled such that their operational efficiency may be optimized (e.g., without detrimentally effecting operation) over a maximum load range specified for the piezoelectric-based device, and this control may occur while the modulation frequency overlaps with one or more spurious mode frequency region. Surprisingly, this converter operation may be realized without dependency of output power on the switching frequency which has been known (e.g., with use of the standard switching sequence in efforts to maximize efficiency) to prevent operation at loads corresponding to spurious mode frequencies. Accordingly, certain exemplary aspects of the present disclosure overcome the dependency of output power on switching frequency and, hence, overcome preventing operation at loads corresponding to spurious mode frequencies. This may be realized, consistent with aspects of the present disclosure, by using a called mixed switching sequence.

Exemplary uses of a mixed switching sequence have been implemented in experimental embodiments to resolve the above issue and in certain more-specific examples, such mixed switching sequences may be used to enable fixed-frequency control of the modulation frequency driving the inputs of the converter. In exemplary contexts, a mixed switching sequence consists of or includes an integer number of forward cycles, $n_f$, mixed with an integer number of zero cycles, $n_z$. A zero cycle has a single switching state, which turns on the switches that short circuit the resonator for the entire resonant period. For the stacked topology, the zero cycle turns on switches $S_2$ and $S_3$ as shown in Table 1.

Unlike forward cycles, zero cycles transfer zero energy since the input and output are never connected to the resonator.

TABLE 1

Stacked Converter Switching States

| State | $V_A$ | $V_B$ | $V_P$ | Switches On |
|---|---|---|---|---|
| A | $V_{out}$ | Open | Open | $S_2$ |
| B | $V_{out}$ | 0 | $V_{out}$ | $S_2, S_4$ |
| C | Open | 0 | Open | $S_4$ |
| D | $V_{in}$ | 0 | $V_{in}$ | $S_1, S_4$ |
| E | $V_{in}$ | Open | Open | $S_1$ |
| F | $V_{in}$ | $V_{out}$ | $V_{in} - V_{out}$ | $S_1, S_3$ |
| G | Open | $V_{out}$ | Open | $S_3$ |
| Zero | $V_{out}$ | $V_{out}$ | 0 | $S_2, S_3$ |

Circulating current, as a zero cycle does, is usually avoided in power converters as it causes extra loss and reduces efficiency. However, piezoelectric resonators are high quality factor devices which allow current to circulate with almost no loss. During a zero cycle, short circuiting the RLC motional branch causes a damped oscillation of the motional current at the series resonant frequency. The oscillation is damped with a time constant of $\tau = Q/\pi f_s$, where Q is the motional branch's quality factor and $f_s$ is the resonator's series resonant frequency. Since the zero cycle frequency clamps to the series resonant frequency $f_s$, the forward cycle frequency shifts to keep the average cycle frequency equal to $f_{sw_0}$.

$$f_f = \frac{(n_f + n_z)f_{sw_0} - n_z f_s}{n_f} \tag{6}$$

Figure 4A:
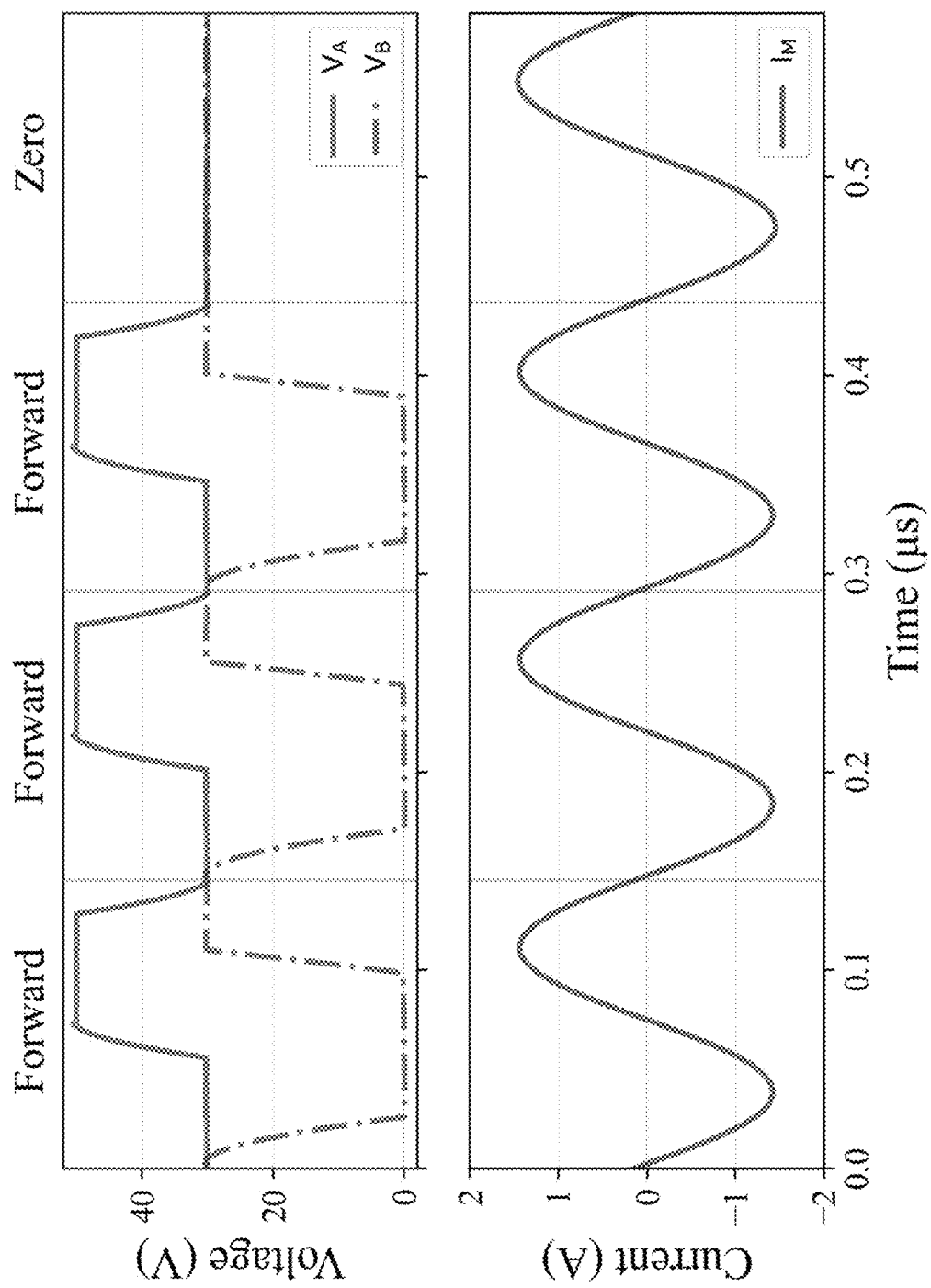
FIGS. 4A and 4B are graphs showing mixed-switching sequence waveforms for different respective ratios of forward to zero cycles, according to certain exemplary aspects of the present disclosure.
Figure 4B:
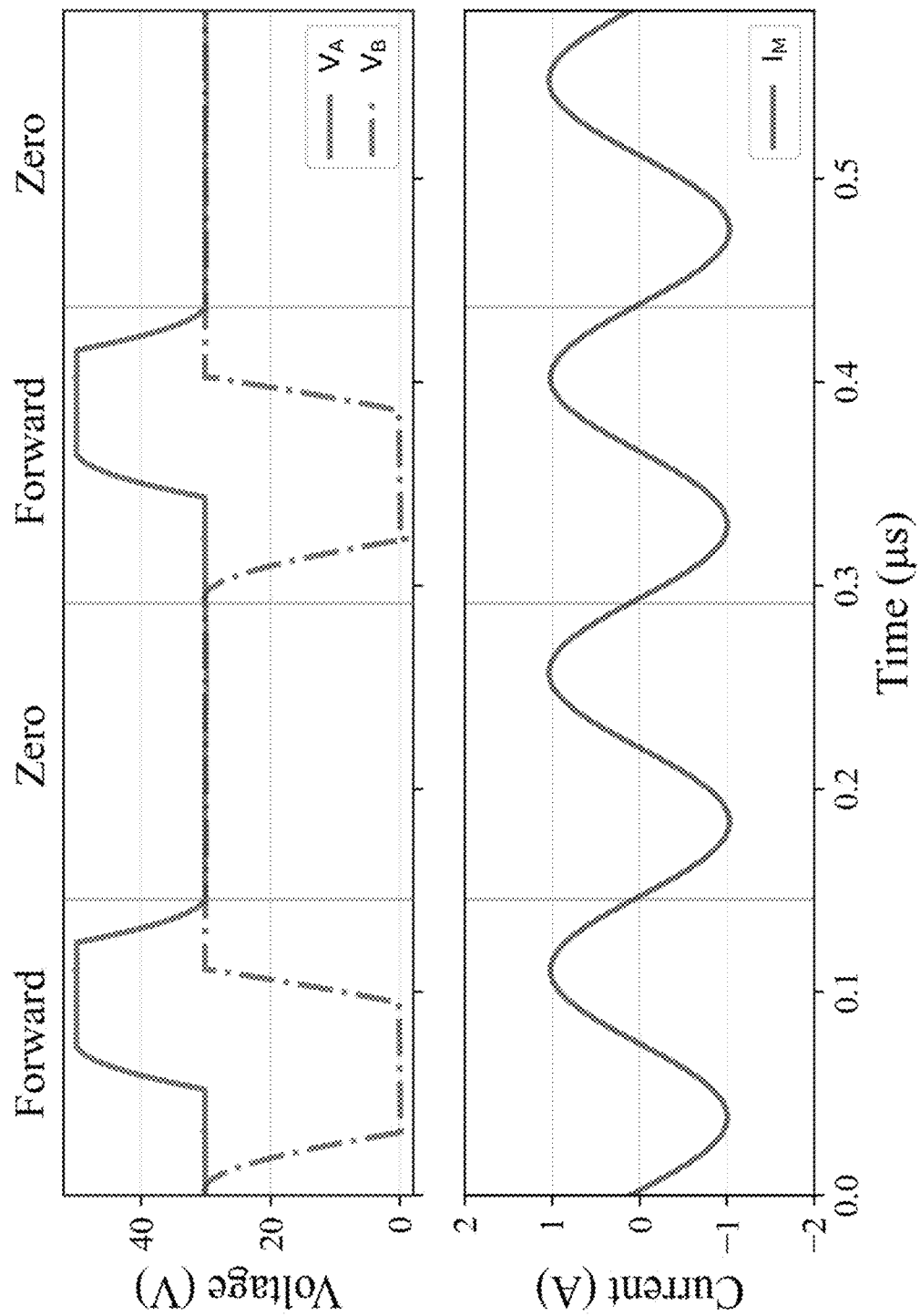

Although forward cycle frequency $f_f$ will shift higher potentially into spurious mode frequencies, FFT analysis in simulation can confirm that the dominant frequency component occurs at $f_{sw_0}$ with all other harmonics attenuated considerably. Moreover, the dependence of output power on the resonator's impedance causes a higher density of operating points near series resonance, so $f_{sw_0}$ often lies close to fs. In this case, the f frequency shifting can be ignored. The following analysis uses the assumption that $f_{sw_0} \approx f_s$. Since Q can reach upwards of 1000 for piezoelectric resonators, the oscillation is very under-damped and can maintain its amplitude for many cycles. Thus, the periodic steady-state motional current approximately stays a fixed-amplitude sine wave throughout a mixed sequence even during the zero cycles. In practice, the switch on-resistance also contributes to the quality factor of the circulating current, but the emergence of wide bandgap devices allows use of low on-resistance GaN switches to keep Q high. FIG. 4A and FIG. 4B show the periodic steady-state voltage and current waveforms for two different mixed sequences, which will be denoted by their ratio of forward to zero cycles as $n^f:n_z$ mixed sequences.

These waveforms are simulated with a resonator of Q=4200, causing the motional branch current amplitude $I_m$ to remain nearly constant during the zero cycles. The motional current resonates at the same switching frequency in both examples, yet the steady-state amplitude $I_m$ differs because of the different $n_f: n_z$ ratios.

A family of mixed sequences is defined as all ratios of $n_f$: $n_z$ that operate at a single cycle frequency, $f_{sw_0}$. Although the family's motional current oscillates at $f_{sw_0}$, a given mixed sequence within the family will have a period of $T_{sw} = (n_f + n_z)/f_{sw_0}$ with $n_f + n_z$ total cycles. The standard switching sequence can be viewed as a special member in a mixed switching sequence family with an $n_f$: ne ratio of 1:0. Since analysis of standard sequences is well established, it is advantageous to express parameters of an arbitrary $n_f$: $n_z$ mixed sequence in terms of the parameters for its family's 1:0 standard sequence. First, a family's motional current amplitude $I_m$ can be derived as a function of $n_f$, $n_z$, and its family's 1:0 sequence $I_{m_0}$. The component of the voltage applied across the resonator at $f_{sw_0}$, for a mixed sequence, $V_m$, can be split into the contributions of forward and zero cycles:

$$V_m = \left(\frac{1}{n_f + n_z}\right)\left(n_f V_{m_f} + n_z V_{m_z}\right) \tag{7}$$

Zero cycles short circuit the resonator's terminals, so $V_{mz}$ is zero. Neglecting the switch timing variations, $V_{mf}$ can be approximated as equal to the standard sequence fundamental voltage component, $V_{m0}$, even though $V_{mf}$ will change slightly throughout a family's different mixed sequence ratios. Similar to how $V_{m0}$ changes less significantly than $Z_m$ in equation (2), $V_{mf}$ will change less significantly than $n_f/(n_f+n_z)$ allowing for this approximation. Therefore, $I_m$ can be represented as a scaling of Imo from substituting equation (2) into equation (7):

$$I_m = (n_f/(n_f+n_z))I_{m_0} \tag{8}$$

This approximation is not exact since varying $I_m$ will change switch timings and $V_{mf}$, but it holds well for larger mixed sequence ratios when $n_f > n_z$. Since only forward cycles transfer charge from the motional branch to the output, the proportionality in equation (5) changes for mixed sequences resulting in $I_{out}$ being proportional to:

$$(n_f/(n_f+n_z))I_m \tag{9}$$

Assuming the same proportionality factor, substituting equation (8) gives the scaling of $I_{out}$ as being equal to:

$$(n_f/(n_f+n_z))^2 I_{out0} \tag{10}$$

Again referring to certain example aspects of the present disclosure, experiments consistent therewith have shown that converter performance via mixed sequence control is effective in scaling for power and efficiency. Mathematically, this may be appreciated as follows. Based on equation (3) and (10), a mixed sequence family's output power relates to its standard sequence power $P_{out0}$ by $P_{out0}$ as being equal to:

$$(n_f/(n_f+n_z))^2 P_{out0} \tag{11}$$

Equation (11) represents how the mixed sequence decouples power and frequency since $P_{out}$ can scale down from $P_{out0}$ at the mixed sequence family's fixed switching frequency, $f_{sw0}$. For spurious mode avoidance, $f_{sw0}$ can be chosen just below the spurious mode frequency range, where standard sequence efficiency is highest. Although equation (11) suggests power can only be scaled with integer ratios, switching frequency is still an optional control variable. Satisfying equation (11) for certain loads may require large values of $n_f$ and $n_z$, yet modulating $f_{sw0}$ within the spurious-free frequency region in conjunction with modulating the mixed sequence ratio can achieve arbitrary output power with only small values of $n_f$ and $n_z$.

To maintain efficient operation, the power loss must also scale down with the output power. The three primary sources of power loss in the converter are the $I^2R$ loss in the motional branch $P_m$, the $I^2R$ loss from the on-resistance of the switches $P_{sw}$, and the dielectric loss in the resonator's parallel input capacitance $P_d$. For the standard sequence, these losses are given by:

$$P_{m_0} = \frac{1}{2} i_{m_0}^2 R_m \quad (12)$$

$$P_{sw_0} = I_{m_0}^2 R_{sw} \quad (13)$$

$$P_{d_0} = \frac{\pi f_{sw_0} C_0 V_{in}^2}{4 Q_E} \quad (14)$$

$R_{sw}$ is the switch on-resistance, and $Q_E$ is the quality factor of the dielectric of the resonator. Since both switches do not conduct during open states, equation (13) overestimates switch conduction loss especially for conditions where open state durations lengthen. The definition of $$Q = \omega \frac{\text{energy stored}}{\text{power loss}}$$

and the peak voltage swing across the resonator in equation (14) are used to derive the dielectric loss $P_{d0}$ with the full derivation presented as described in the above-referenced U.S. Provisional Application. These loss sources result in a standard sequence efficiency of:

$$\eta_0 = \frac{P_{out_0}}{P_{out_0} + P_{m_0} + P_{sw_0} + P_{d_0}} \quad (15)$$

Comparing how the mixed sequence losses scale with output power, the motional and switch conduction losses depend on $I_m^2$ and will scale with $$\left(\frac{n_f}{n_f + n_z}\right)^2.$$

The dielectric loss depends on the frequency of forward cycles and will scale with $$\left(\frac{n_f}{n_f + n_z}\right)$$

Substituting, the efficiency of the mixed sequence follows:

$$\eta = \frac{P_{out_0}}{P_{out_0} + P_{m_0} + P_{sw_0} + \left(\frac{n_f + n_z}{n_f}\right) P_{d_0}} \quad (16)$$

At higher power when $n_f > n_z$, the I R losses for $P_{m_0}$ and $P_{sw_0}$ dominate the dielectric loss $P_{d_0}$, and the efficiency while scaling down power can be approximated as constant ($\eta \approx \eta_0$). However, scaling to lower power when $n_f < n_z$ causes forward cycle switch timings to diverge more from the 1:0 standard sequence. This causes the $V_{mf} = V_{m_0}$ approximation used for motional current scaling to become less valid resulting in more loss and divergence from the constant efficiency model.

In certain experimental implementations, use of a mixed switching sequence may introduce more input current ripple and output voltage ripple. Even in the standard control mode, charge only flows to the output during certain connected switching states. Thus, the output voltage ripple can be approximated by how much the voltage decreases when the output is disconnected and only the converter's output capacitance $C_{out}$ can supply current to the load. For the standard sequence, the longest period the output is disconnected varies with load but can be roughly approximated as $T_{sw}/4$, a quarter of the switching cycle. This yields a standard sequence output voltage ripple of:

$$\Delta v_{out,pp_0} = \frac{I_{out_0}}{4 f_{sw_0} C_{out}} \quad (17)$$

A mixed sequence will cause the output load to be disconnected for the forward cycle's $T_{sw}/4$ in addition to $k_z T_{sw}$, where variable $k_z$ is the largest number of consecutive zero cycles throughout the mixed sequence. To minimize output voltage ripple, mixed sequences should alternate forward and zero cycles as much as possible to minimize $k_z$. Any sequence with $n_f \geq n_z$ can mix the forward and zero cycles to make $k_z = 1$. For example, arranging a 3:2 sequence as $[2n_f, n_z, n_f, n_z]$ yields $k_z = 1$ rather than arranging as $[3n_f, 2n_z]$ with $k_z = 2$. Substituting for current scaling, the mixed sequence output voltage ripple becomes:

$$\Delta v_{out,pp} = \left(k_z + \frac{1}{4}\right)\left(\frac{n_f}{n_f + n_z}\right)^2 \left(\frac{I_{out_0}}{f_{sw_0} C_{out}}\right) \quad (18)$$

A worst case $\Delta v_{out,pp}$ may occur in the limit as "$n_f/(n_f+n_z)$" approaches one with an output voltage ripple five times greater than $\Delta v_{out,pp_0}$. Although fixed-frequency control causes the output voltage ripple to increase, the intrinsic high switching frequency of piezoelectric resonator DC-DC converters allows small output voltage ripple while only using relatively small values and volumes of $C_{out}$. Additionally, operating multiple converters in parallel and offsetting their zero cycle locations can help cancel the output voltage ripple. Similar analysis applies for the input current ripple.

Figure 5:
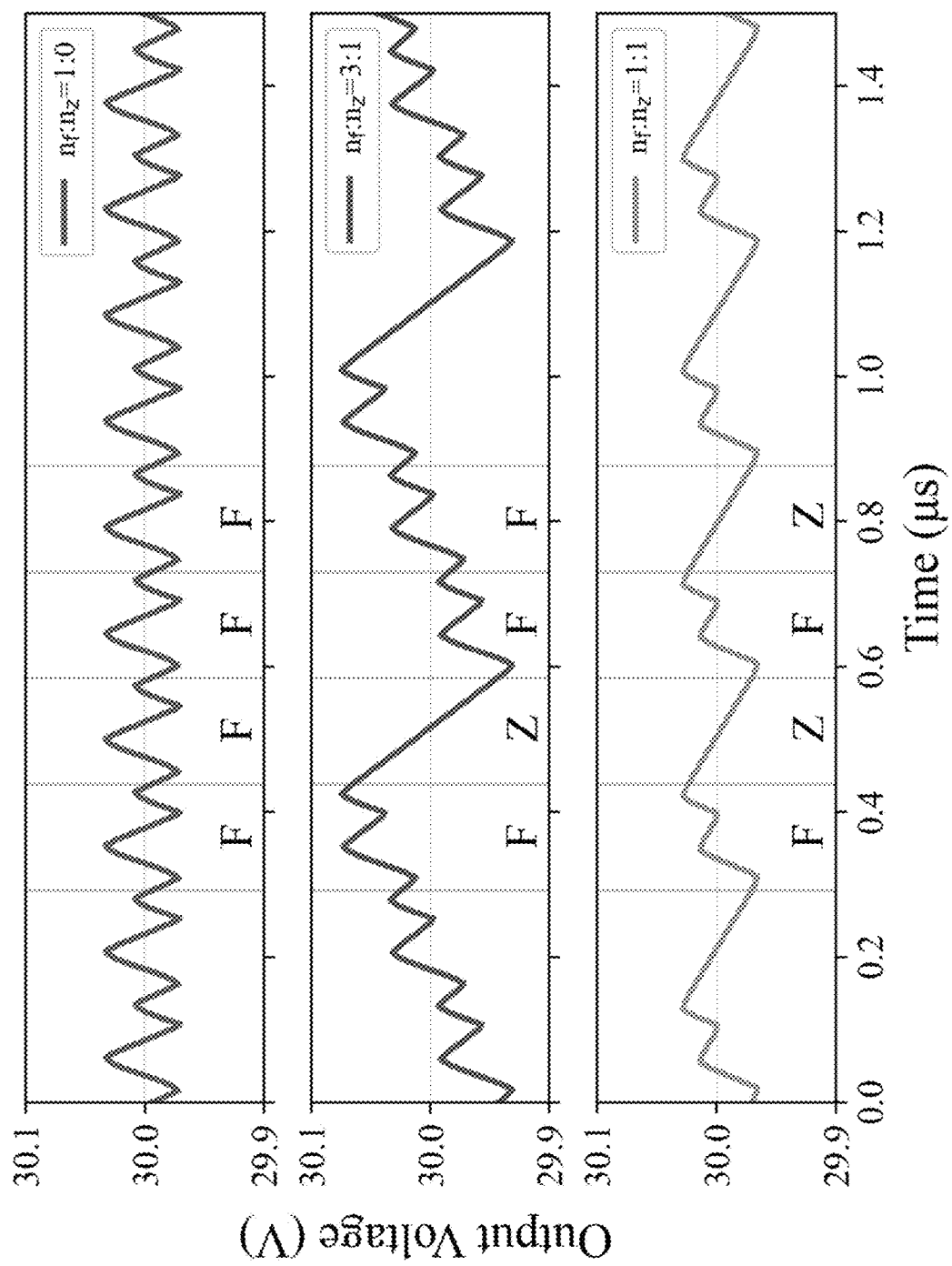
FIG. 5 is a graph showing simulated output voltage waveforms for each of three different mixed-switching sequence ratios for an experimental prototype, according to certain exemplary aspects of the present disclosure.

FIG. 5 shows the simulated output voltage ripple waveforms for three different mixed sequence ratios. The simulation has 1.0 pF for $C_{out}$, a conversion ratio of 50 V to 30 V, and a switching frequency of 6.84 MHz. The output currents $I_{out}$ for the $n_f:n_z$ ratios 1:0, 3:1, and 1:1 are 1.49 A, 0.84 A, and 0.36 A, respectively. These currents agree with the mixed sequence output current scaling model. The 1:0 sequence has a simulated output voltage ripple of 62 mV, and the model from equation (17) predicts 54 mV. The 3:1 ratio waveform exhibits larger output voltage ripple with the output voltage rising over the three consecutive forward cycles before falling during the zero cycle. The 3:1 sequence's simulated output voltage ripple is 143 mV, while the model from equation (18) predicts 149 mV.

To better understand response in connection with such experimental embodiments, it is appreciated that the mixing of forward and zero cycles in fixed-frequency control can be implemented to resemble on/off modulation used for controlling resonant DC-DC converters (such as described above and in the above-referenced U.S. Provisional Application). Both schemes pulse power to the output, which enables low complexity hysteretic control and fast transitions to lower power levels. However, converters using on/off modulation dissipate their resonant branch energy immediately at turn-off through a low quality factor output branch. Alternatively, the proposed mixed sequence control circulates energy within its resonant branch, which enables fast transitions to higher power states, as well. An instructive way to view the circulating energy is by examining the ratio of energy stored in the resonator to the average energy delivered to the output each cycle:

$$E_{stored}/E_{out} = f_{sw0} L_m I_m^2 / 2 P_{out} \qquad (19)$$

The two variables $I_m^2$ and $P_{out}$ scale with $(n_f/(n_f+n_z))^2$, so this ratio will stay constant for all $n_f$ and $n_z$. Essentially, the excess energy being circulated serves as a reservoir for fast transitions to higher power, while the discrete on/off nature of the mixed-sequence allows fast transitions to lower power. Closed-loop hysteretic voltage regulation with fixed-frequency control can also alleviate the slow transients incurred from the piezoelectric resonator's high quality factor by operating at a lower switching frequency and resonator impedance than standard control, so this ratio will stay constant for all $n_f$ and $n_z$. Essentially, the excess energy being circulated serves as a reservoir for fast transitions to higher power, while the discrete on/off nature of the mixed-sequence allows fast transitions to lower power. Closed-loop hysteretic voltage regulation with fixed-frequency control can also alleviate the slow transients incurred from the piezoelectric resonator's high quality factor by operating at a lower switching frequency and resonator impedance than standard control. To help appreciate what is meant by fast transitions to lower power, as examples, the term fast refers to or includes signal transition speeds at which the voltage or current settling time of the input or output occurs faster than what is capable without the proposed fixed-frequency control with circulating current, and the term lower power refers to or includes any step in output power in which the final output power is less than the starting output power.

Discussion now turns to exemplary switch timings in certain experimental embodiments according to the present disclosure. Common methods of calculating switch timings oftentimes require solving systems of many equations using conservation of charge and energy constraints. The number of equations to solve is proportional to the number of switching states in a sequence, and the mixed switching sequence produces over $n^f$ times more states than the standard sequence. In lieu of solving systems of hundreds of equations, a simplified approach starts with the assumption that the motional current is a constant amplitude sine wave. Making this assumption over the whole mixed sequence (no damping or frequency variations), leads to the expression for motional current: $i_m(t) = I_m \sin(2\pi f_{sw_0} t)$. Known motional current Imo for the standard sequence at a given frequency and equation (8) give $I_m$. During an open state, the voltage across the resonator $V_{p,open}(t)$ changes as:

$$\frac{dv_{p,open}}{dt} = -\frac{i_m(t)}{C_o} \qquad (20)$$

Integrating for state C gives:

$$\Delta v_{p,open,C} = \frac{I_m}{wC_o}(\cos(wt_C) - \cos(wt_B)) \qquad (21)$$

The beginning and end of open state C occur at times $t_B$ and $t_C$, respectively. The change in voltage $\Delta V_{p,open}$ follows from the chosen switching sequence. For example, looking at the connected state switching node voltages bordering the open states in Table 1 for the stacked topology's [$V_{out}$, $V_{in}$, $V_{in}-V_{out}$] sequence gives expressions for $\Delta V_{p,open}$.

Additionally, energy must be conserved for the input and output during connected states. For the [$V_{out}$, $V_{in}$, $V_{in}-V_{out}$] sequence, the conservation of energy constraint is given by:

$$-q_B V_{out} + q_D V_{in} + q_F(V_{in} - V_{out}) = 0 \qquad (22)$$

The $q_n$ represents the charge transferred during a connected state, which is equal to the integral of the motional current throughout the state. For example, state B has a charge transfer of:

$$q_B = -\frac{I_m}{w}(\cos(wt_B) - \cos(wt_A)) \qquad (23)$$

Solving the system of equations produced by applying equations (8), (21), (22), and (23) to a switching sequence results in switch timings in terms of $I_{m0}$, $n_f$, $n_z$, and known parameters. Table 2 shows the switch timings calculated for the sequence [Vout, Vin, Vin–Vout] and conversion ratios of $V_{out} < V_{in} < 2V_{out}$ where $t_A$ corresponds with the time state A ends.

For more accurate switch timings, this method could be modified to include the cycle to cycle variations of $I_m$ as the current ramps up or dampens depending on the type of cycle. Another improvement could compensate for the frequency differences of forward and zero cycles using (6).

TABLE 2

Scaled Switch Timings for Sequence [$V_{out}$, $V_{in}$, $V_{in} - V_{out}$]

| Time | Value |
|---|---|
| $t_A$ | $\frac{1}{w}\arccos\left(1 - \frac{n_f + n_z}{n_f}\frac{wC_o(V_{in} - V_{out})}{I_{m_0}}\right)$ |
| $t_B$ | $\frac{T_{sw}}{2} - \frac{1}{w}\arccos\left(1 - \frac{n_f + n_z}{n_f}\frac{wC_o V_{out}}{I_{m_0}}\right)$ |
| $t_C$ | $\frac{T_{sw}}{2}$ |
| $t_D$ | $T_{sw} - \frac{1}{w}\arccos\left(\cos(wt_E) - \frac{n_f + n_z}{n_f}\frac{wC_o(V_{in} - V_{out})}{I_{m_0}}\right)$ |
| $t_E$ | $T_{sw} - \frac{1}{w}\arccos\left(\frac{3V_{out} - V_{in} - \frac{n_f + n_z}{n_f}\frac{wC_o V_{out}^2}{I_{m_0}}}{V_{out} - V_{in}}\right)$ |
| $t_F$ | $T_{sw} - \frac{1}{w}\arccos\left(1 - \frac{n_f + n_z}{n_f}\frac{wC_o V_{out}}{I_{m_0}}\right)$ |
| $t_G$ | $T_{sw}$ |

Figure 6:
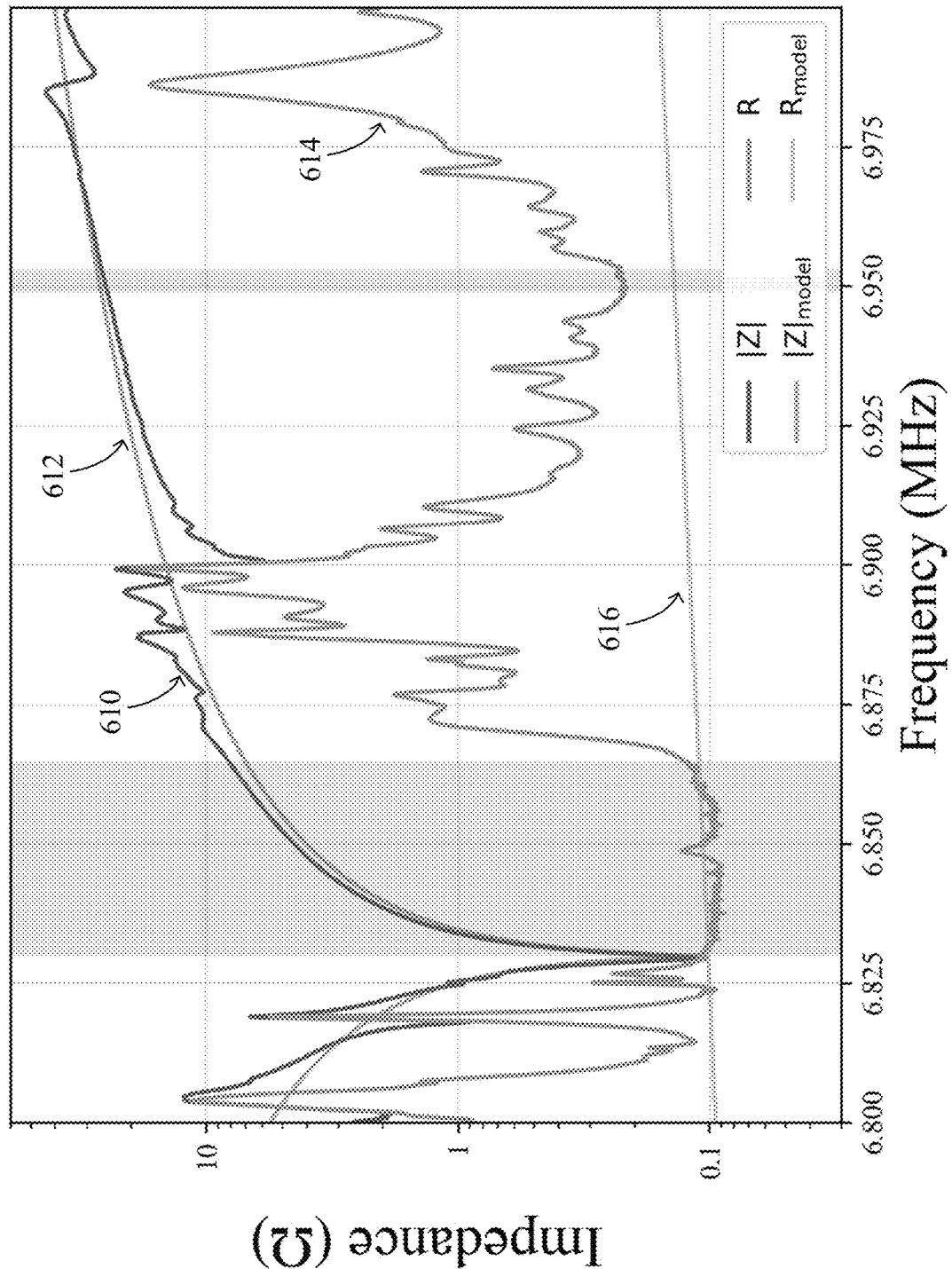
FIG. 6 is a graph plotting, for an experimental prototype according to the present disclosure, of a resonator's impedance near its 6.83 MHz series resonance.

To verify the fixed-frequency control, an exemplary type of prototype piezoelectric resonator DC-DC converter was tested via an experimental prototype with the lithium niobate resonator from above equation [6]. A modified mounting scheme enabled a reduction in $R_m$ to 100 mΩ from 190 mΩ in the previous demonstration with this resonator. This mounting scheme attaches bond wires to both edges of the resonator instead of one, reducing the series resistance through the 400 nm resonator electrodes and bond wires. Table 3 lists the resonator's BVD circuit parameters, and FIG. 6 plots the resonator's impedance near its 6.83 MHz series resonance. Only the spurious-free region from 6.835 MHz to 6.861 MHz and the single frequency of 6.952 MHz allow converter operation. Outside of these frequencies, spurious modes drive losses too high to operate. In FIG. 6, the plot lines 610, 612 respectively show actual and modeled impedance ("Z"), whereas the plot lines 614, 616 respectively show actual and modeled resistance ("R").

TABLE 3

Prototype Converter and Resonator Component Values

| Component | Value |
|---|---|
| S1-4 | EPC2012C |
| Gate Driver | LMG1210 |
| 5V Isolators | ADuM5028-5BRIZ |
| $L_m$ | 15.1 µH |
| $C_m$ | 36.0 pF |
| $R_m$ | 100.0 mΩ |
| $C_o$ | 145.0 pF |

One such experimental prototype converter includes a power board and a resonator carrier board. The carrier board only houses the mounted resonator and connects to the power board using board-to-board connectors with a 1.5 mm mated height. The use of a carrier board for the resonator allows a single converter to test multiple resonators and keeps the series inductance to the resonator low by placing it right beneath the switching nodes. The switch signals, which are calculated with the methods described herein for calculating switching timings, are produced externally by an XC7S25 FPGA and sent to the power board through a ribbon cable for open loop control. A 24-length bit array loaded to the FPGA defines the sequence of forward and zero cycles. A power supply and an electronic DC load were connected to the input and output, respectively, to step up voltage to the desired operating point at a fixed ratio.

First, the prototype converter tested the standard sequence control across its spurious-free operating range. All of the following testing used a conversion ratio of 60 V to 30 V. A 2:1 conversion ratio was chosen since it maximizes efficiency, yet piezoelectric resonator DC-DC converters can operate across a wide range of conversion ratios as shown with the same resonator in equation [6]. Just past series resonance at 6.84 MHz, the converter achieves a maximum output power of 51.3 W with efficiency of 94.5%. Here, the 32×13×0.5 mm resonator achieves a component power density of 246.6 W/cm³. Shown in FIG. 7, increasing frequency from 6.84 MHz reduces the power while increasing the efficiency. The last standard control operating point before encountering spurious modes occurs at 6.861 MHz with an output power of 33.1 W and a peak efficiency of 96.7%. This peak-efficiency operating point is chosen as the 1:0 mixed sequence in the family of mixed sequences with $\beta_{sw_0}$ of 6.861 MHz.

Figure 7:
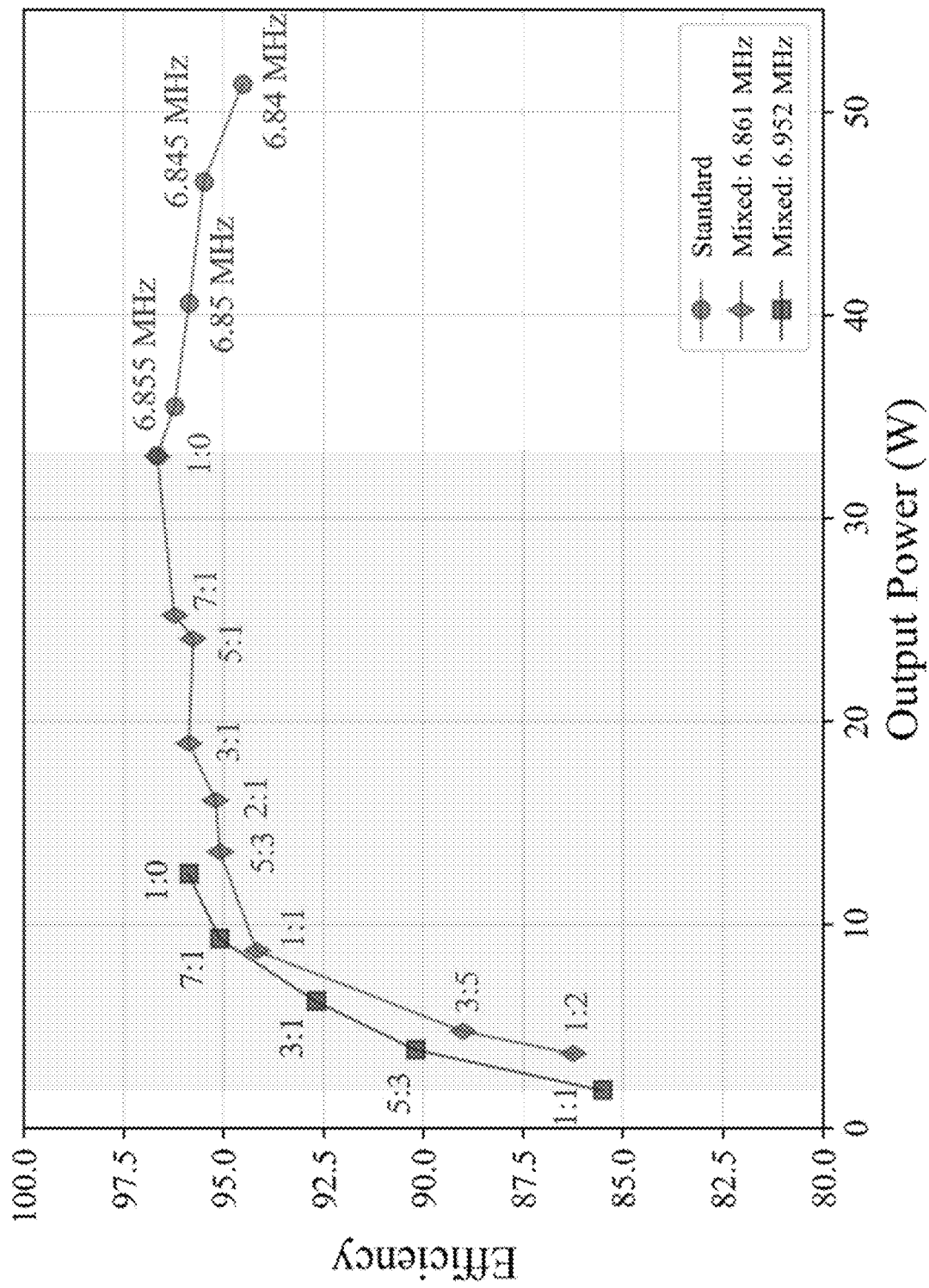
FIG. 7 is a graph plotting efficiency (Y axis) as a function of output power (X axis) for standard and mixed switching sequences, also according to the present disclosure.
Figure 8:
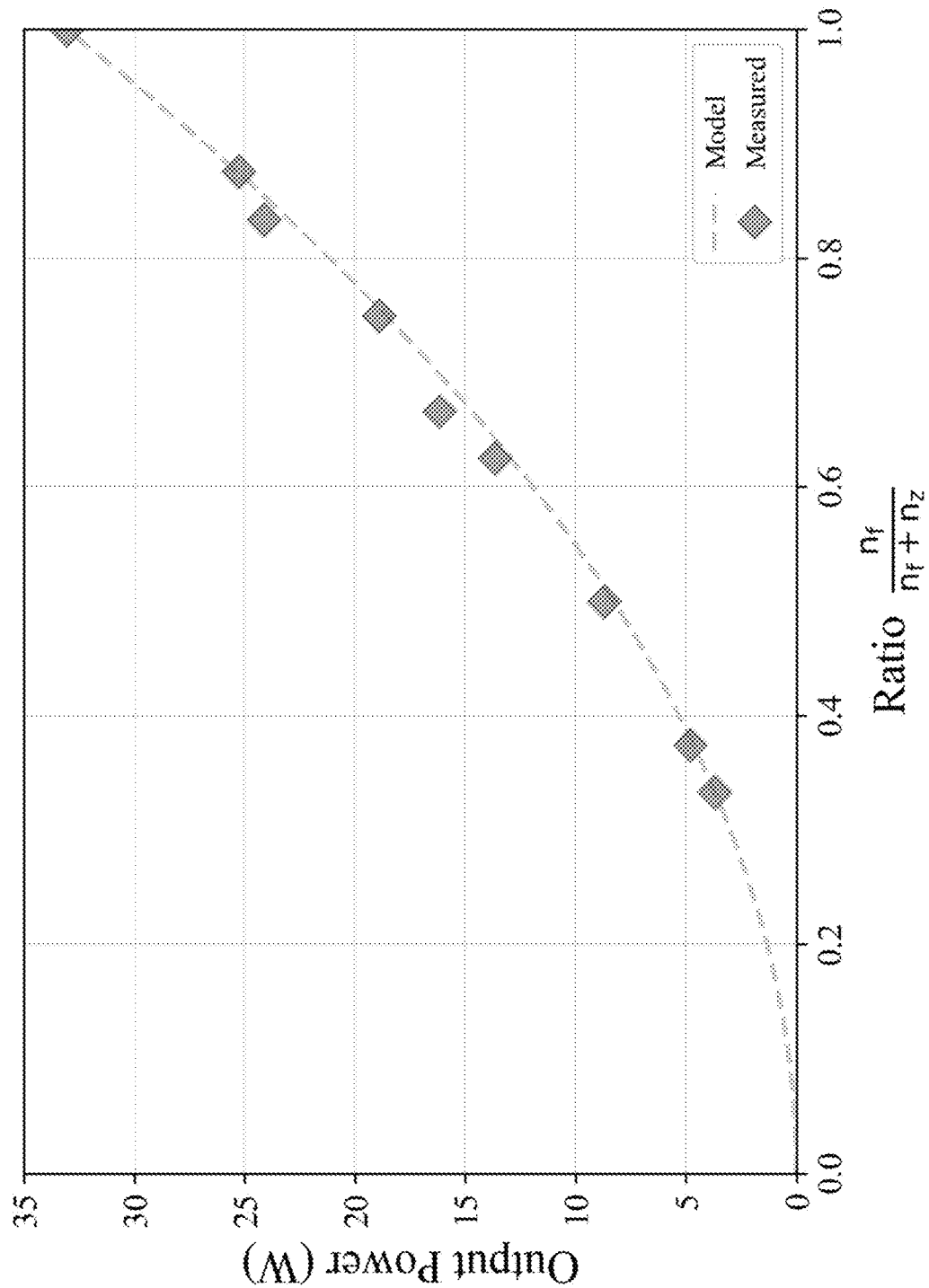
FIG. 8 is a graph plotting modeled and measured output power (Y axis) scaled down from $P_{out0}$ for an experimental prototype, also according to the present disclosure.
Figure 9:
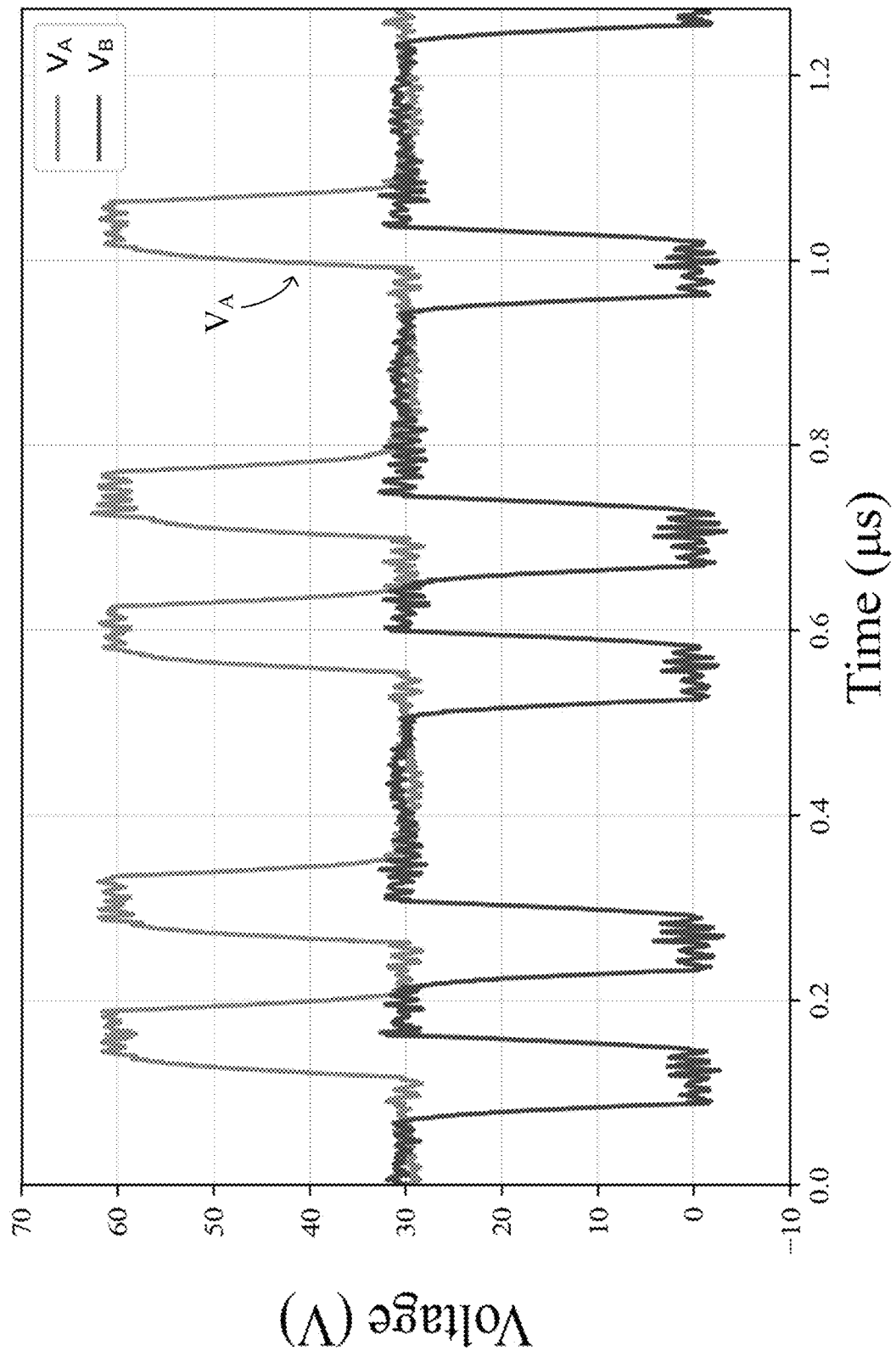
FIG. 9 is a graph plotting measured switching node voltages (Y axis) for an exemplary 5:3 forward-zero cycle ratio in connection with an experimental prototype according to the present disclosure.

Next, the converter tested the 6.861 MHz family of mixed sequences to verify the fixed-frequency control mode. FIG. 7 shows how efficiency scales with different mixed sequence ratios. For larger mixed sequence ratios with $n^f > n_z$, the efficiency stays close to no of 96.7% as modeled. Specifically, the efficiency remains above 95% for ratios down to 5:3, spanning the load range from 33.1 W to 13.6 W. Below 5:3, the efficiency begins diverging faster for reasons discussed in Section III. The efficiency scaling model in (16) can be fitted retrospectively to match the general behavior of the experimental data, but the model is sensitive to initial conditions and parameters that are difficult to accurately measure. The model for scaling $P_{out}$ by $$\left(\frac{n_f}{n_f + n_z}\right)^2$$

from (11) matches the measured data across all the mixed sequence ratios as seen in FIG. 8. Scope traces in FIG. 9 show the switching node voltage waveforms for a 5:3 mixed sequence. The forward and zero cycles are properly mixed as $[2n_f, n_z, 2n_f, n_z, n_f, n_z]$ to minimize ripple. The series inductance to the resonator and slight missing of ZVS cause the high frequency ringing at the switching nodes. At 6.861 MHZ, the quality factor of the circulating zero cycle current path is 2170, which includes the 100 mΩ added from each EPC2012 C GaN transistor. This high quality factor ensures the motional branch current will remain sinusoidal with minimal damping and power loss throughout the zero cycles. The fact that all the open transitions for the switching nodes in FIG. 9 achieve soft switching confirms the motional current amplitude remains constant and at a similar frequency during zero cycles.

Fixed-frequency control was also applied to the mixed sequence family with $f_{sw_0}$ at 6.952 MHz. At low output power, the 6.952 MHz family has higher efficiency than the 6.861 MHz family clue to its lower mixed sequence ratios. This exemplifies how the fixed-frequency control can enable spurious mode hopping where the converter operates at multiple spurious-free fixed frequencies that have spurious modes between them. At the load conditions corresponding to the spurious-free frequencies, maximum efficiency standard sequence control can be used. But to bridge between the spurious-free regions, fixed-frequency control can be used. Enabling the ability for spurious mode hopping can further simplify resonator design. Designing a resonator free of spurious modes across its entire operating range is exceedingly difficult and likely comes at the cost of higher resistance from damping out minor spurious modes. However, designing a resonator with localized, high quality factor spurious modes and well-defined spurious-free regions can be readily achieved.

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices and examples as described hereinabove may also be found in the Appendix of the above-referenced Provisional Application.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as layers, blocks, modules, device, system, unit, controller, and/or other circuit-type depictions (e.g., control logic 120, 120' and switching circuitry 115, 115' of FIGS. 1A and 1B). Such semiconductor and/or semiconductive materials (including piezoelectric materials and/or portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. A method for use with a piezoelectric-based device including a resonator, the method comprising
   selectively switching inputs of the piezoelectric-based device at a modulation frequency, including causing a short across terminals of the resonator, and, in response, decoupling the modulation frequency from output power delivered by the piezoelectric-based device.

2. The method of claim 1, further including causing circulation of current in the piezoelectric-based device by the step of selectively switching inputs.

3. The method of claim 1, wherein the modulation frequency is a fixed frequency, and the selectively switching inputs provide control that does not rely on acoustic optimization.

4. The method of claim 1, wherein the piezoelectric-based device operates without manifesting a spurious mode.

5. The method of claim 1, wherein the piezoelectric-based device refers to or is integrated as part of a DC-DC converter, and the short across terminals of the resonator occurs for a resonant period.

6. The method of claim 1, wherein the inputs of the piezoelectric-based device are selectively switched to provide closed-loop, hysteretic control, and said selectively switching inputs of the piezoelectric-based device causes decoupling the modulation frequency from output power delivered by the piezoelectric-based device and causes operation of the piezoelectric-based device without spurious mode operation.

7. A method comprising:
   selectively switching inputs of a piezoelectric-based device including a resonator, at a modulation frequency and, in response, decoupling the modulation frequency from output power delivered by the piezoelectric-based device, wherein the piezoelectric-based device operates without detrimentally effecting operation efficiency over a maximum load range specified for the piezoelectric-based device while the modulation frequency overlaps with one or more spurious mode frequency regions.

8. An apparatus comprising: a piezoelectric-based device; and a logic circuit to selectively switch inputs of the piezoelectric-based device at a modulation frequency and, in response, decouple the modulation frequency from output power delivered by the piezoelectric-based device for a resonant period.

9. The apparatus of claim 8, wherein the piezoelectric-based device includes a resonator, and the logic circuit is to cause circulation of current in the piezoelectric-based device, and to cause a short across terminals of the resonator.

10. The apparatus of claim 8, wherein the piezoelectric-based device is to operate without manifesting a spurious mode while the modulation frequency is at a fixed frequency.

11. The apparatus of claim 8, wherein the inputs are selectively controlled by using a mixed switching sequence having an integer number of forward cycles and an integer number of zero cycles, wherein the integer number of forward cycles is at least one and the integer number of zero cycles is at least one.

12. A method comprising:
    selectively switching inputs of a piezoelectric-based device at a frequency in a frequency range that intersects with a spurious mode region of the piezoelectric-based device to cause current circulation in the piezoelectric-based device while avoiding spurious mode operation of the piezoelectric-based device.

13. The method of claim 12, further including causing circulation of current in the piezoelectric-based device by the step of selectively switching inputs, and the piezoelectric-based device operates without manifesting a spurious mode.

14. The method of claim 12, wherein the piezoelectric-based device operates without detrimentally effecting operation efficiency over a maximum load range specified for the piezoelectric-based device while the frequency is a modulation frequency which overlaps with one or more spurious mode frequency regions.

15. The method of claim 12, wherein the inputs of the piezoelectric-based device are to be selectively switched to provide closed-loop, hysteretic control.

16. The method of claim 12, wherein the inputs are selectively controlled by using a mixed switching sequence having an integer number of forward cycles and an integer number of zero cycles, wherein the integer number of forward cycles is at least one and the integer number of zero cycles is at least one.

17. An apparatus comprising:
    a piezoelectric-based device; and
    a logic circuit to selectively switch inputs of the piezoelectric-based device at a frequency in a frequency range that intersects with a spurious mode region of the piezoelectric-based device while avoiding spurious mode operation of the piezoelectric-based device.

18. The apparatus of claim 17, wherein the logic circuit is to cause circulation of current in the piezoelectric-based device, and the piezoelectric-based device operates without manifesting a spurious mode, and wherein the piezoelectric-based device refers to or is integrated as part of a DC-DC converter.

19. The apparatus of claim 17, wherein the piezoelectric-based device operates without detrimentally effecting operation efficiency over a maximum load range specified for the piezoelectric-based device while the frequency is a modulation frequency which overlaps with one or more spurious mode frequency regions.

20. The apparatus of claim 17, wherein the inputs are selectively controlled by using a mixed switching sequence having an integer number of forward cycles and an integer number of zero cycles, wherein the integer number of forward cycles is at least one and the integer number of zero cycles is at least one.

21. The apparatus of claim 17, wherein the inputs are selectively switched without relying on unidirectional powerflow with each resident cycle and on soft charging of output capacitance of the piezoelectric-based device, and the inputs of the piezoelectric-based device are to be selectively switched to provide closed-loop, hysteretic control with fast transients.

\* \* \* \* \*